Figure 1:
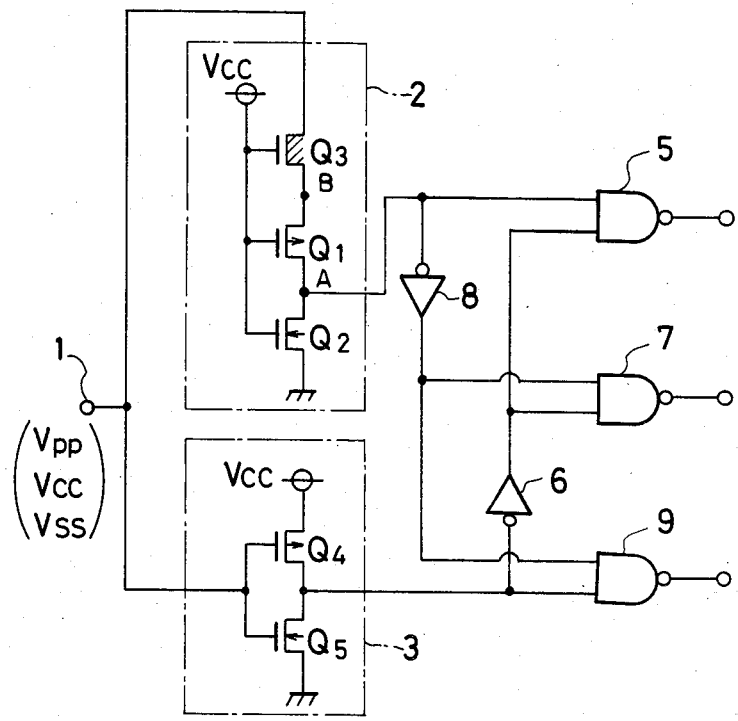

United States Patent [19]

Kyomasu

[11] Patent Number: 4,682,052
[45] Date of Patent: Jul. 21, 1987

[54] INPUT BUFFER CIRCUIT

[75] Inventor: Mikio Kyomasu, Hamamatsu, Japan

[73] Assignee: Ricoh Company Ltd., Tokyo, Japan

[21] Appl. No.: 693,017

[22] Filed: Jan. 18, 1985

[30] Foreign Application Priority Data

Jan. 20, 1984 [JP] Japan ................................. 59-9064

[51] Int. Cl.[4] .................... H03K 17/30; H03K 17/693
[52] U.S. Cl. .................................. 307/361; 307/264; 307/451; 307/473; 307/475
[58] Field of Search ............... 307/451, 473, 475, 360, 307/361, 244, 577, 579, 584, 585, 264

[56] References Cited

U.S. PATENT DOCUMENTS

| | | | |
|---|---|---|---|
| 4,302,690 | 11/1981 | Gollinger et al. | 307/451 |
| 4,350,906 | 9/1982 | Gillberg | 307/473 X |
| 4,475,050 | 10/1984 | Noufer | 307/475 |
| 4,503,340 | 3/1985 | Linder | 307/360 |
| 4,543,498 | 9/1985 | Gorecki | 307/360 |
| 4,572,977 | 2/1986 | Takemae et al. | 307/360 X |
| 4,584,491 | 4/1986 | Ulmer | 307/451 X |

Primary Examiner—Stanley D. Miller
Assistant Examiner—D. R. Hudspeth
Attorney, Agent, or Firm—Cooper, Dunham, Griffin & Moran

[57] ABSTRACT

An input buffer circuit comprised of MOS transistors includes an input terminal for receiving a tri-state input signal capable of taking any one of three potential levels, such as $V_{pp}$, $V_{cc}$ and $V_{ss}$. The input buffer circuit also includes a first detecting circuit having a first threshold level located between $V_{pp}$ and $V_{cc}$ and a second detecting circuit having a second threshold level located between $V_{cc}$ and $V_{ss}$. Also provided is a third detecting circuit connected to the first and second detecting circuits to determine the level of the input signal applied to the input terminal.

5 Claims, 2 Drawing Figures

INPUT BUFFER CIRCUIT

BACKGROUND OF THE INVENTION

1. Field of the Invention

The present invention generally relates to an input buffer circuit which is provided at the input section of a digital circuit, and, in particular, to such an input buffer circuit comprised of MOSFETs.

2. Description of the Prior Art

In digital circuits such as programmable logic arrays (PLAs), programmable array logics (PALs) and programmable read only memories (PROMs), in addition to a two-level signal having low and high states, it is often required to use a signal of higher level, for example, for programming. In a circuit requiring an input signal of three or more levels, the number of input pins, when manufactured as a semiconductor device, is required to be increased corresponding to the number of levels of input signal. For this reason, the resulting device tends to become larger in size and higher in cost.

SUMMARY OF THE INVENTION

In accordance with the present invention, there is provided an input buffer circuit having an input terminal to which a tri-level input signal having first, second and third levels, which become lower in level in the order mentioned, may be applied. The present input buffer circuit comprises first level detecting means having a first threshold which is between said first and second levels of said input signal, second level detecting means having a second threshold which is between said second and third levels of said input signal and determining means connected to said first and second level detecting means to determine the level of said input signal.

It is therefore a primary object of the present invention to obviate the disadvantages of the prior art as described above and to provide an improved input buffer circuit.

Another object of the present invention is to provide an input buffer circuit suitable for manufacture as a semiconductor device, which can be manufactured with ease at low cost.

A further object of the present invention is to provide an input buffer circuit having an input terminal to which a tri-level signal can be applied.

Other objects, advantages and novel features of the present invention will become apparent from the following detailed description of the invention when considered in conjunction with the accompanying drawillustrated embodiment, such a tri-level input signal may take any one of the three levels including a high level $V_{pp}$, an intermediate level $V_{cc}$ and a low level $V_{ss}$. As is obvious for one skilled in the art, it may be easily understood that $V_{ss}$ indicates ground level and $V_{cc}$ indicates supply voltage level with $V_{pp}$ indicating programming voltage level.

The input buffer circuit of FIG. 1 also comprises a first level detecting circuit 2 which has a threshold level which is lower than $V_{pp}$ but higher than $V_{cc}$. In the embodiment of FIG. 1, the first level detecting circuit 2 includes a P-channel MOS transistor $Q_1$ and an N-channel MOS transistor $Q_2$, which are connected in a CMOS structure. The NMOS transistor $Q_2$ has an ON-resistance which is much larger than the ON-resistance of the PMOS transistor $Q_1$. The PMOS transistor $Q_1$ has its source connected to the source of a depletion type NMOS transistor $Q_3$ and its drain connected to the drain of NMOS transistor $Q_2$ whose source is grounded. The MOS transistors $Q_1$, $Q_2$ and $Q_3$ have their gates commonly connected and also connected to supply voltage $V_{cc}$, intermediate in level. The drain of depletion type NMOS transistor $Q_3$ defines an input to the first level detecting circuit 2 and it is connected to the input terminal 1 of the present input buffer circuit. The interconnection A between the transistors $Q_1$ and $Q_2$ defines an output of the first level detecting circuit 2.

The input buffer circuit of FIG. 1 also includes a second level detecting circuit 3 which is basically a CMOS inverter comprised of a P-channel MOS transistor $Q_4$ and an N-channel MOS transistor $Q_5$. Thus, the PMOS transistor $Q_4$ has its source connected to supply voltage $V_{cc}$ and its drain connected to the drain of NMOS transistor $Q_5$ whose source is grounded. Both of the transistors $Q_4$ and $Q_5$ have their gates commonly connected and also connected to the input terminal 1 to which a tri-level signal is applied. The interconnection between the two transistors $Q_4$ and $Q_5$ defines an output of the second level detecting circuit.

Also provided is a 2-input NAND gate 5 which has its one input connected to receive an output signal from the first level detecting circuit 2 and the other input connected to receive an output signal from the second level detecting circuit 3 through an inverter 6, and the NAND gate 5 will provide a high level output signal in response to the high state of the input signal applied to the input terminal 1. Another 2-input NAND gate 7 is provided to provide an intermediate level output signal in response to the intermediate state of the input signal $Q_3$ and $Q_1$ also increases thereby causing the MOS transistor $Q_1$ to turn on. When the voltage at the interconnection B has reached the voltage level of ($V_{cc}$ - (effective threshold voltage of $Q_3$)), then the MOS transistor $Q_3$ is turned off, and, thus, a further increase in the input signal causes no further changes in the voltage level at the interconnection A. Thus, the voltage at point B becomes fixed. Here, the term "effective threshold voltage" indicates a voltage which is obtained from a threshold voltage with a correction of the so-called body effect. Under the condition, both of the MOS transistors $Q_1$ and $Q_2$ are turned on so that the first level detecting circuit 2 supplies a high level output signal H.

On the other hand, if the input signal having the intermediate level $V_{cc}$ or low level $V_{ss}$ is applied to the input terminal 1, the MOS transistor $Q_3$ is turned on thereby causing the voltage level at the interconnection B to be lower than $V_{cc}$ so that the MOS transistor $Q_1$ is turned off thereby causing the first level detecting circuit 2 to supply a low level output signal L.

If the input signal having the high level $V_{pp}$ or intermeditate level $V_{cc}$ is applied to the input terminal 1, the second level detecting circuit 3 supplies a low level output L; whereas, if the input signal applied to the input terminal 1 is at low level $V_{ss}$, then the second level detecting circuit 3 supplies a high level output signal H as its output.

In the embodiment illustrated in FIG. 1, if the input signal applied to the input terminal 1 is at high level $V_{pp}$, the first level detecting circuit 2 supplies a high level output signal H and the second level detecting circuit 3 supplies a low level output signal L. Thus, only the NAND gate 5 is activated to supply a low level output. Under the circumstances, the other two NAND gates 7 and 9 remain inactivated thereby supplying a high level output H.

If the input signal applied to the input terminal 1 is at intermediate level $V_{cc}$, the first level detecting circuit 2 supplies a low level output signal L and the second level detecting circuit 3 also supplies a low level output signal L. Accordingly, only the NAND gate 7 is activated to supply a low level output signal L with the other two NAND gates 5 and 9 held inactivated thereby supplying a high level output signal H.

If the input signal applied to the input terminal 1 is at low level $V_{ss}$, the first level detecting circuit 2 supplies a low level output signal L and the second level detecting circuit 3 supplies a high level output signal H. As a result, only the NAND gate 9 is activated to supply a low level output signal L at its output while the other two NAND gates 5 and 7 remain inactivated thereby supplying a high level output signal H at their output.

In this manner, in accordance with the present invention, in response to the input signal applied to the input terminal 1, only one of the NAND gates 5, 7 and 9 is activated to supply a low level output signal depending on the level of the input signal. It is to be noted that the first and second level detecting circuits 2 and 3 should not be limited only to the structure disclosed in FIG. 1 and they may take any other structure.

Figure 2:
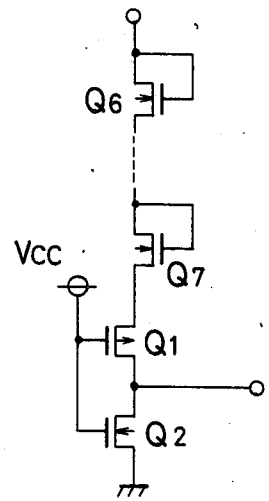

FIG. 2 shows an alternative structure for the first level detecting circuit 2 in the present input buffer circuit. In the alternative structure shown in FIG. 2, a series of diode-connected MOS transistors (only $Q_6$ and $Q_7$ are shown) is provided instead of the depletion type MOS transistor $Q_3$ in the embodiment of FIG. 1. Such a diode-connected MOS transistor may be provided singularly or in plural in number. In this alternative embodiment, it is so structured that utilizing a voltage drop resulting from the threshold voltage of such diode-connected MOS transistor, if the input signal applied to the input terminal 1 is at high level $V_{pp}$, the MOS transistor $Q_1$ is turned on; whereas, if the input signal applied to the input terminal 1 is at intermediate level $V_{cc}$ or at low level $V_{ss}$, the MOS transistor $Q_1$ is turned off.

It is to be noted as a further alternative structure that either of the first and second level detecting circuits 2 and 3 may be constructed using NMOS inverters as is obvious for one skilled in the art in view of the principle of the present invention. In this case, it is only necessary to set the threshold level of a driver transistor at an appropriate level. It is to be noted that the determining structure for receiving output signals from the first and second level detecting circuits 2 and 3 and to indicate the level of the input signal applied to the input terminal 1 should not be limited only to the example comprised of NAND gates and inverters shown in FIG. 1. Other structures may manifest themselves for one skilled in the art once the principle of the present invention has been fully understood. In addition, in the illustrated embodiment, the input signal to be applied to the input terminal 1 has been described to have three levels: $V_{pp}$, $V_{cc}$ and $V_{ss}$; however, the input signal to be applied to the input terminal 1 should not be limited to a signal having these three levels but it can have any other levels.

While the above provides a full and complete disclosure of the preferred embodiments of the present invention, various modifications, alternate constructions and equivalents may be employed without departing from the true spirit and scope of the invention. Therefore, the above description and illustration should not be construed as limiting the scope of the invention, which is defined by the appended claims.

What is claimed is:

1. Circuitry comprising:
input means for receiving an input signal capable of taking any one of first, second and third levels;
first detecting means connected to said input means and having a first threshold level which is lower than said first level but higher than said second level for outputting a first result of comparison between said input signal and said first threshold level, wherein said first detecting means includes a CMOS inverter and a depletion type MOS transistor connected in series with said CMOS inverter having a source/drain connected to a first reference potential, said depletion type MOS transistor having a source/drain connected to said input means;
second detecting means connected to said input means and having a second threshold level which is lower than said second level but higher than said third level for outputting a second result of comparison between said input means and said second threshold level; and
third detecting means connected to said first and second detecting means for determining the level of said input signal applied to said input signal in accordance with said first and second results and for outputting a signal which is a function of the level of the input signal applied to the input means.

2. The circuitry of claim 1 wherein both of said CMOS inverter and said depletion type MOS transistor have their gates connected to a second reference potential.

3. The circuitry of claim 2 wherein said first reference potential is ground and said second reference potential is equal to said second level.

4. The circuitry of claim 2 wherein said second detecting means includes a CMOS inverter connected between said first and second reference potentials and having its gate connected to said input means.

5. The circuitry of claim 4 wherein said third detecting means includes a first NAND gate having a first input connected to receive an output signal from said first detecting means and a second input connected to receive an output signal from said second detecting means through a first inverter; a second NAND gate having a first input connected to receive an output signal from said first detecting means through a second inverter and a second input connected to receive an output signal from said second detecting means through said first inverter; and a third NAND gate having a first input connected to receive an output signal from said first detecting means through said second inverter and a second input connected to receive an output signal from said second detecting means.

* * * * *